US011561442B2

(12) United States Patent
Yang

(10) Patent No.: US 11,561,442 B2
(45) Date of Patent: Jan. 24, 2023

(54) METHOD FOR MANUFACTURING DISPLAY PANEL, DISPLAY PANEL, AND DISPLAY DEVICE

(71) Applicant: HKC CORPORATION LIMITED, Shenzhen (CN)

(72) Inventor: Chunhui Yang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 122 days.

(21) Appl. No.: 17/042,841

(22) PCT Filed: Dec. 12, 2018

(86) PCT No.: PCT/CN2018/120482
§ 371 (c)(1),
(2) Date: Sep. 28, 2020

(87) PCT Pub. No.: WO2020/098032
PCT Pub. Date: May 22, 2020

(65) Prior Publication Data
US 2021/0028193 A1    Jan. 28, 2021

(30) Foreign Application Priority Data

Nov. 14, 2018   (CN) .......................... 201811350597.7

(51) Int. Cl.
*G02F 1/1362*    (2006.01)
*H01L 27/12*    (2006.01)

(52) U.S. Cl.
CPC .. *G02F 1/136209* (2013.01); *G02F 1/136222* (2021.01); *H01L 27/124* (2013.01); *H01L 27/1259* (2013.01)

(58) Field of Classification Search
CPC ..................... G02F 1/136209; G02F 1/136222
See application file for complete search history.

(56) References Cited

U.S. PATENT DOCUMENTS

2006/0038932 A1    2/2006  Murade
2006/0250536 A1*  11/2006  Kim .................. G02F 1/136209
                                                         349/43

(Continued)

FOREIGN PATENT DOCUMENTS

CN          102236228 A      11/2011
CN          104267534 A  *    1/2015   ....... G02F 1/133512

(Continued)

OTHER PUBLICATIONS

Songjiang Wu, the ISA written comments, dated Jul. 2019, CN.
Songjiang Wu, the International Search Report, dated Jul. 2019, CN.

*Primary Examiner* — Peter M Albrecht

(57) ABSTRACT

This application discloses a method for manufacturing a display panel, a display panel, and a display device. The display panel has a display area and a peripheral area. The display panel includes a first substrate, a second substrate, a plurality of pixel elements, a plurality of data lines and scanning lines, and a plurality of color filters. The first substrate includes a first shading layer, the first shading layer being formed between two neighboring pixel elements to block the data lines or the scanning lines. The display area includes an opening area and a non-opening area, and the first shading layer is arranged only in the non-opening area. The second substrate includes a second shading layer arranged corresponding to the first shading layer. Each of the data lines and the scanning lines is blocked by at least one of the first shading layer and the second shading layer.

17 Claims, 12 Drawing Sheets

(56) References Cited

U.S. PATENT DOCUMENTS

| | | | | |
|---|---|---|---|---|
| 2010/0007811 A1* | 1/2010 | Choi | ................. | G02F 1/136209 |
| | | | | 349/43 |
| 2011/0001909 A1* | 1/2011 | Tseng | ................ | G02F 1/136209 |
| | | | | 349/106 |
| 2015/0219972 A1* | 8/2015 | Yang | ................. | G02F 1/136209 |
| | | | | 349/43 |
| 2015/0370105 A1* | 12/2015 | Hong | ................ | G02F 1/133512 |
| | | | | 349/43 |
| 2016/0299395 A1* | 10/2016 | Kosuge | ............. | G02F 1/136209 |

FOREIGN PATENT DOCUMENTS

| | | | |
|---|---|---|---|
| CN | 104267534 | A | 1/2015 |
| CN | 104865730 | A | 8/2015 |
| CN | 107799566 | A | 3/2018 |
| CN | 108803179 | A | 11/2018 |

* cited by examiner

METHOD FOR MANUFACTURING DISPLAY PANEL, DISPLAY PANEL, AND DISPLAY DEVICE

CROSS REFERENCE OF RELATED APPLICATIONS

This application claims the priority to the Chinese Patent Application No. CN201811350597.7, filed with National Intellectual Property Administration, PRC on Nov. 14, 2018 and entitled "METHOD FOR MANUFACTURING DISPLAY PANEL, DISPLAY PANEL, AND DISPLAY DEVICE", which is incorporated herein by reference in its entirety.

TECHNICAL FIELD

This application relates to the field of display technologies, and in particular, to a method for manufacturing a display panel, a display panel, and a display device.

BACKGROUND

It should be understood that descriptions herein merely provide background information related to this application, and do not necessarily constitute the prior art.

With the development and advancement of science and technologies, owing to hot spots such as thin body, power saving, and low radiation, displays become mainstream products of displays and are widely applied. A flat panel display includes a thin film transistor-liquid crystal display (TFT-LCD), an organic light-emitting diode (OLED) display, and the like. The TFT-LCD controls rotating directions of liquid crystal molecules, to enable light in a backlight source to be refracted out to generate a picture, and the TFT-LCD has various advantages such as thin body, power saving, and no radiation.

A display panel of a display includes an may substrate and a color filter substrate. In the process manufacturing the display panel, a cell-assembly error is likely introduced in a process of cell-assembling the array substrate and the color filter substrate, leading to light leakage.

SUMMARY

A technical problem to be solved by this application is to provide a method for manufacturing a display panel, a display panel, and a display device, to prevent light leakage of the display panel.

This application provides a display panel, having a display area and a peripheral area, and including: a first substrate; a second substrate, cell-assembled to the first substrate; a plurality of pixel elements, arranged on the first substrate; a plurality of data lines and scanning lines, arranged on the first substrate and between two neighboring pixel elements; and a plurality of color filters, arranged above the corresponding pixel elements on the first substrate, the first substrate includes a first shading layer, the first shading layer being formed between two neighboring pixel elements to block the data lines or the scanning lines; the display area includes an opening area and a non-opening area, and the first shading layer is arranged only in the non-opening area; the second substrate includes a second shading layer arranged corresponding to the first shading layer; and each of the data lines and the scanning lines is blocked by at least one of the first shading layer and the second shading layer.

Compared with the solution in which the shading layer is arranged only on the first substrate or the second substrate, in this application, the first shading layer is arranged on the first substrate, the second shading layer is arranged on the second substrate, and the first shading layer is arranged corresponding to the second shading layer, so that when the first substrate and the second substrate are cell-assembled, the first shading layer on the first substrate can shade the part that needs to be shaded on the first substrate, and the second shading layer on the second substrate can shade the part that needs to be shaded on the second substrate, thereby avoiding light leakage resulting from misalignment between the shading layer and the part that needs to be shaded on the first substrate or the second substrate due to a cell-assembly error.

BRIEF DESCRIPTION OF DRAWINGS

The drawings included are used for providing understanding of embodiments of the present application, constitute part of the specification, and are used for illustrating implementation manners of the present application, and interpreting principles of the present application together with text description. Apparently, the accompanying drawings in the following descriptions are merely some embodiments of this application, and a person of ordinary skill in the art can also obtain other accompanying drawings according to these accompanying drawings without involving any creative effort. In the accompanying drawings.

DETAILED DESCRIPTION OF EMBODIMENTS

Figure 1:
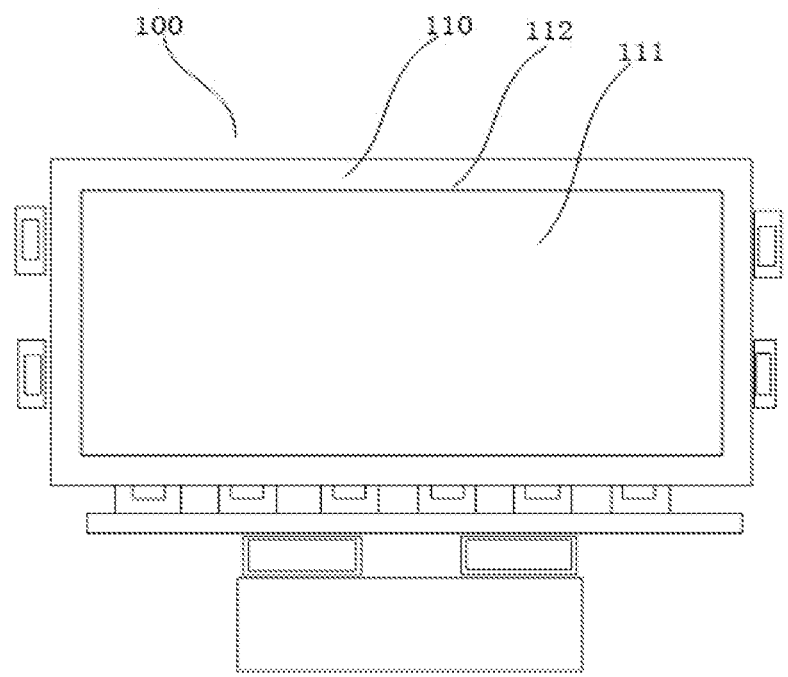
FIG. 1 is a schematic diagram of a display device according to an embodiment of this application.

A process of manufacturing an exemplary color on array (COA) array substrate includes eight manufacture procedures: a first metal layer/an amorphous silicon layer/a second metal layer/a passivation layer/red color filter/a green color filter/a blue color filter/a planarization layer/a transparent conductive thin film:

The first metal layer is the first manufacture procedure: generating a gate electrode and a common electrode line. The amorphous silicon layer is the second manufacture procedure: generating a semiconductor layer. The second metal layer is the third manufacture procedure: generating a source electrode and a drain electrode. The passivation layer is the fourth manufacture procedure: a protective layer of the second metal layer. The red color filter, the green color filter, and the blue color filter are the fifth manufacture procedure, the sixth manufacture procedure and the seventh manufacture procedure: color photoresist layers. The transparent conductive thin film is the eighth manufacture procedure: a pixel electrode. Eight masks are needed. A color film substrate has two manufacture procedures including a black matrix layer and a spacer, and requires two masks. The function of the black matrix layer manufacture procedure of the color film substrate is to block scattered light of a liquid crystal layer, prevent color mixing between sub-pixels, and prevent ambient light from illuminating a TFT channel, and prevent light leakage caused by disturbed liquid crystal orientation due to a disturbed electric field near data lines and scanning lines.

However, in an actual manufacturing process, especially in an process of cell-assembling the array substrate and the color film substrate, misalignment between the black matrix layer and the common electrode on the array substrate easily occurs, which leads to light leakage between the common electrode and the data line, greatly affecting the product yield. Increasing the width of the black matrix layer resolve this problem but will reduce the product transmittance. Therefore, there is an urgent need of a novel pixel architecture design on the premise of ensuring the transmittance.

This application is further described below with reference to the accompanying drawings and embodiments.

As shown in FIG. 2 to FIG. 11 and FIG. 16, embodiments of this application disclose a display panel 110, including: a first substrate 120; a second substrate 140 cell-assembled to the first substrate 120; a plurality of pixel elements 124 arranged on the first substrate 120; a plurality of data lines 121 and scanning lines 221 arranged on the first substrate 120 and between neighboring two pixel elements 124; and a plurality of color filters 129 arranged above the corresponding pixel elements 124 on the first substrate 120. The first substrate 120 includes a first shading layer 123. The display panel 110 has a display area 111 including an opening area 113 and a non-opening area 114. The first shading layer 123 is formed between two neighboring pixel elements 124 to block the data lines 121 or the scanning lines 221. The first shading layer 123 is arranged only in the non-opening area 114 of the display area 111. The second substrate 140 includes a second shading layer 141 arranged corresponding to the first shading layer 123. Each of the data lines 121 and the scanning lines 221 is blocked by at least one of the first shading layer 123 and the second shading layer 141.

Specifically, the first substrate 120 is an array substrate in which the color filters 129 are arranged on an array side, and the second substrate 140 is a common substrate. The pixel elements 124 and the corresponding color filters 129 form pixels.

In an exemplary solution, the shading layers blocking the data lines 121 or the scanning lines 221 may all be arranged on the second substrate 140. For such a design, the shading layer may fail to block the data line 121 or the scanning line 221 because of misalignment that occurs when the first substrate 120 and the second substrate 140 are cell-assembled, leading to light leakage. If only the shading layer arranged on the second substrate 140 is widened or lengthened to resolve this problem, the effective transmittance area of the display panel 110 will be reduced, and the light transmittance will also be reduced, affecting the display effect of the display panel 110. In this solution, not only the second shading layer 141 is arranged on the second substrate 140, but also the first shading layer 123 is arranged between neighboring two pixel electrodes 125 of the first substrate 120, so that no matter whether the first shading layer 123 is arranged in a one-to-one correspondence with the data line 121 and the scanning line 221, the first shading layer 123 can accurately block the data line 121 or the scanning line 221, thereby alleviating the light leakage problem that occurs when the first substrate 120 and the second substrate 140 are misaligned with each other. In addition, the first shading layer 123 is also located between neighboring two color filters, and the first shading layer 123 and the color filters may be on the same or different layers. When the first shading layer 123 and the color filters are on the same layer, the first shading layer 123 is located between neighboring two color filters, and can block the gap between the two color filters, prevent color mixing between the neighboring two color filters, and planarize the color photoresist layer. When the first shading layer 123 and the color filter are on different layers, the first shading layer 123 can block the gap between the two color filters to prevent light leakage, and provides a position for placement of a support layer between the first substrate 120 and the second substrate 140.

That each of the data line 121 and the scanning lines 221 is blocked by at least one of the first shading layer 123 and the second shading layer 141 includes three cases. In a first case, all the data lines 121 or the scanning lines 221 are blocked by both the two types of shading layers. In a second case, some of the data lines 121 or the scanning lines 221 are blocked by the first shading layer 123, the other data lines 121 or scanning lines 221 are blocked by the second shading layer 141. In a third case, some of the data lines 121 or the scanning lines 221 are blocked the first shading layer 123, some are blocked by the second shading layer 141, and some are blocked by both the two types of two shading layers, as long as each of the data lines 121 and the scanning lines 221 is blocked by at least one of the first shading layer 123 and the second shading layer 141.

Compared with the solution in which the shading layer is arranged only on the first substrate 120 or the second substrate 140, in this application, the first shading layer 123 is arranged on the first substrate 120, the second shading layer 141 is arranged on the second substrate 140, and the first shading layer 123 is arranged corresponding to the second shading layer 141, so that when the first substrate 120 and the second substrate 140 are cell-assembled, the first shading layer 123 on the first substrate 120 can shade the part that needs to be shaded on the first substrate 120, and the second shading layer 141 on the second substrate 140 can shade the part that needs to be shaded on the second substrate 140, thereby avoiding light leakage resulting from misalignment between the shading layer and the part that needs to be shaded on the first substrate 120 or the second substrate 140 due to a cell-assembly error.

In one or more embodiments, the pixel element 124 includes a first pixel element 130 and the data line 121 arranged on an outer side the first pixel element 130. The first pixel element 130 includes a first thin film transistor switch 138, a first pixel electrode 131, and a first common electrode line 132 arranged on an outer side of the first pixel electrode 131. The first common electrode line 132 and the first pixel electrode 131 are on different layers and partially overlap each other. The first common electrode line 132 is arranged on a side of the data line 121, and a first gap 133 is provided between the first common electrode line 132 and the data line 121. The first pixel electrode 131 is connected to a source electrode 151 or a drain electrode 152 of the first thin film transistor switch 138 through a via-hole. The first shading layer 123 blocks the data line 121, the first gap 133, and the first common electrode line 132, and extends beyond an edge of the first common electrode line 132 close to the first pixel electrode 131.

Figure 2:
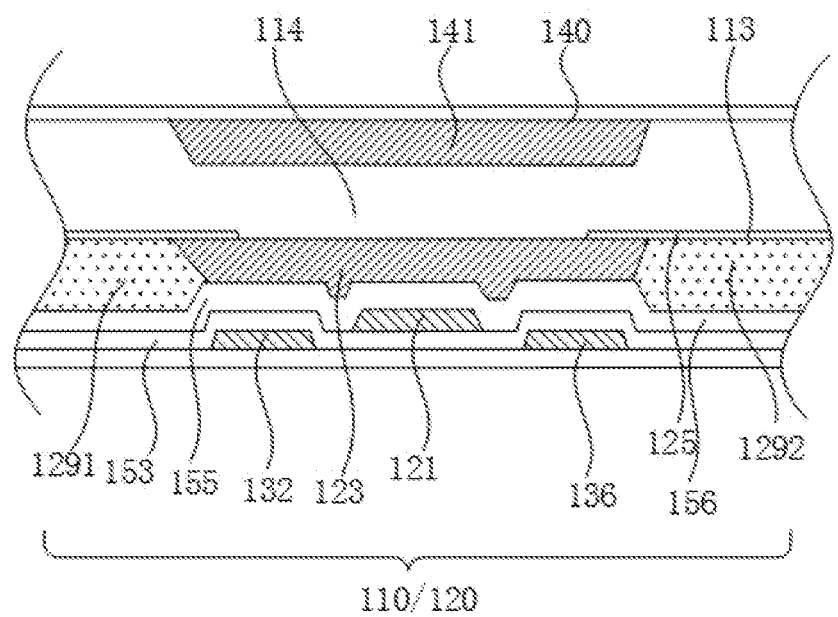
FIG. 2 is a schematic cross-sectional view of a display panel according to an embodiment of this application.
Figure 3:
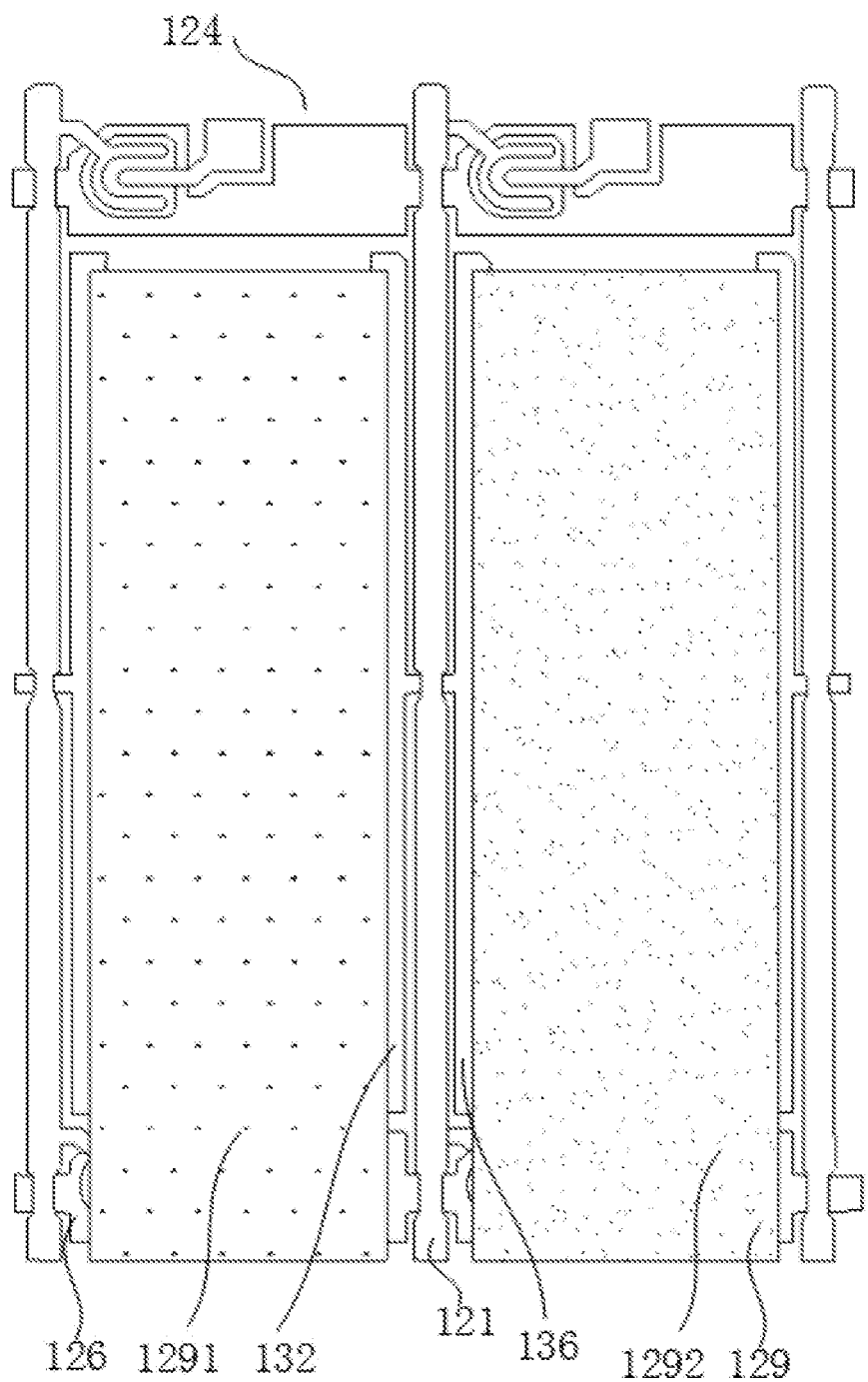
FIG. 3 is a schematic diagram of a pixel element according to an embodiment of this application.
Figure 4:
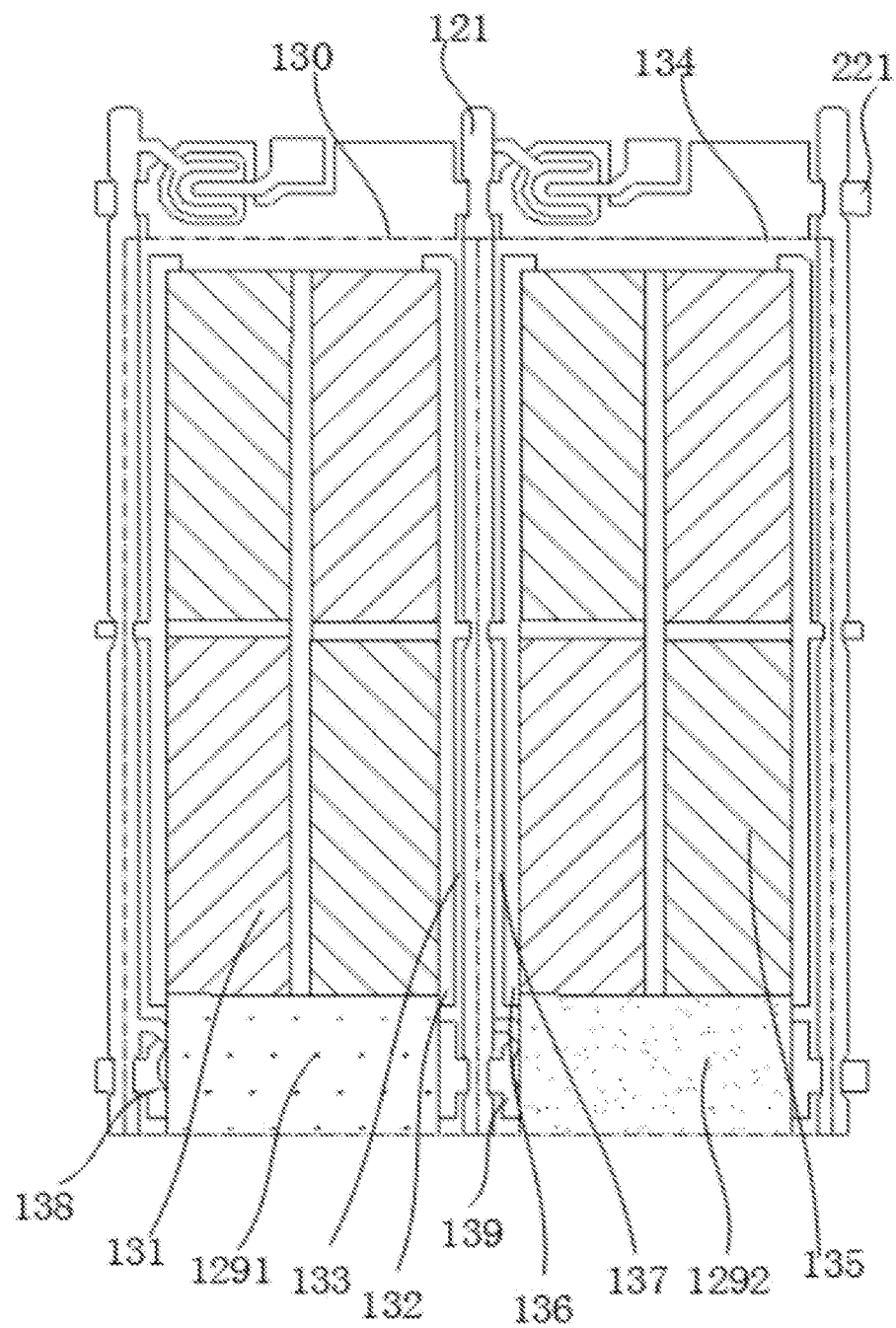
FIG. 4 is a schematic diagram of another pixel element according to an embodiment of this application.
Figure 5:
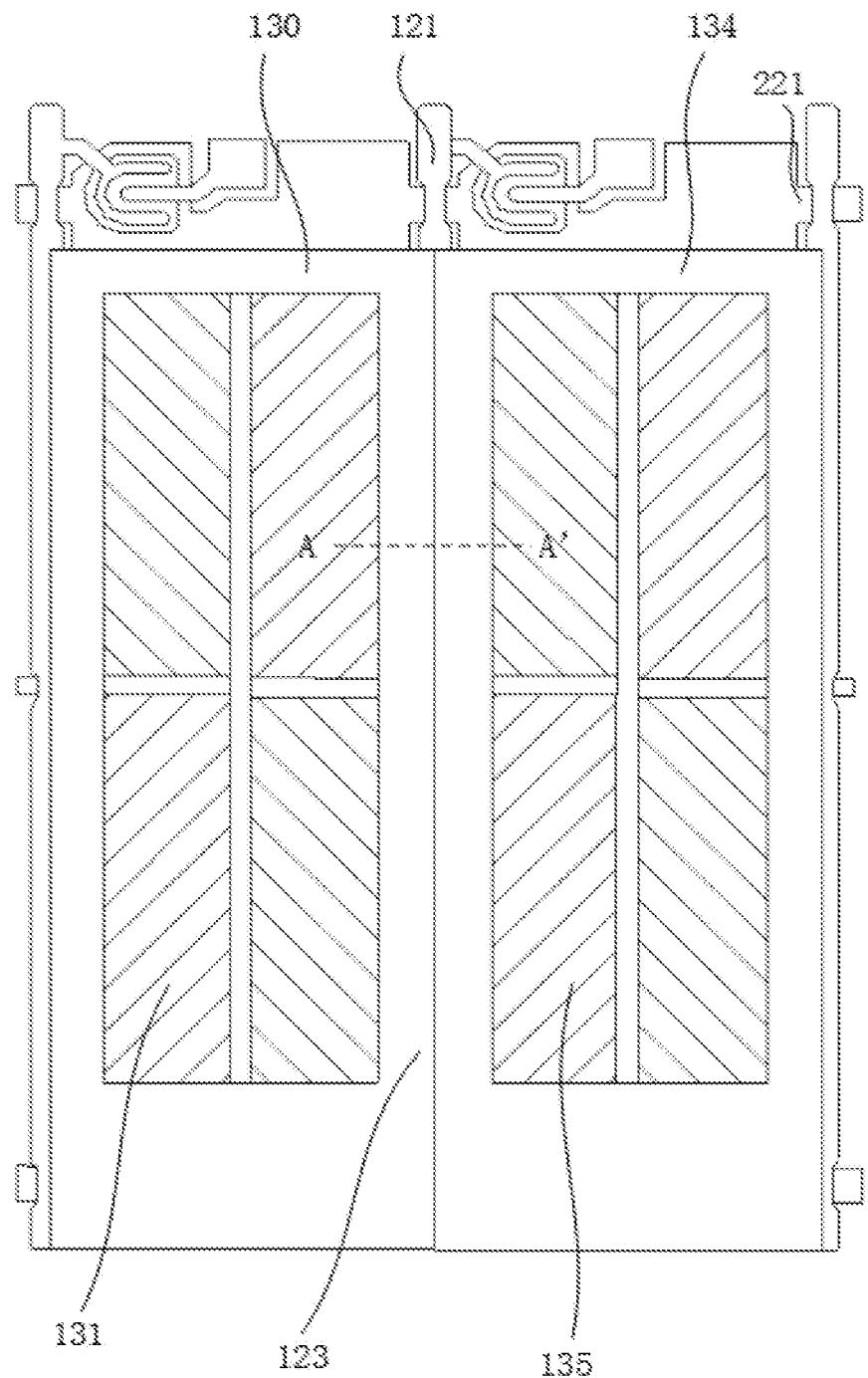
FIG. 5 is a schematic diagram of another pixel element according to an embodiment of this application.
Figure 6:
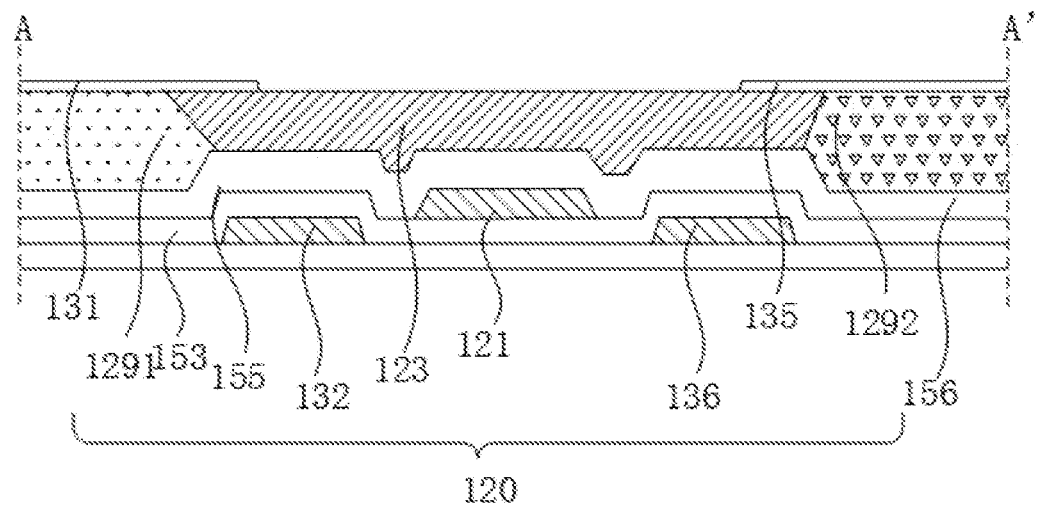
FIG. 6 is a schematic cross-sectional view taken along line A-A' according to an embodiment of this application.
Figure 7:
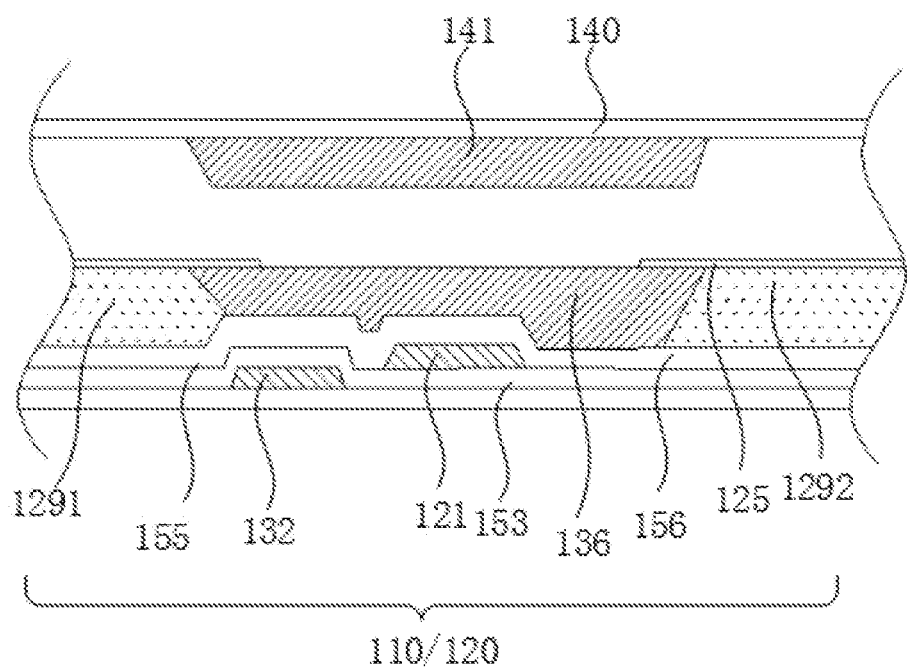
FIG. 7 is a schematic cross-sectional view of another display panel according to an embodiment of this application.
Figure 8:
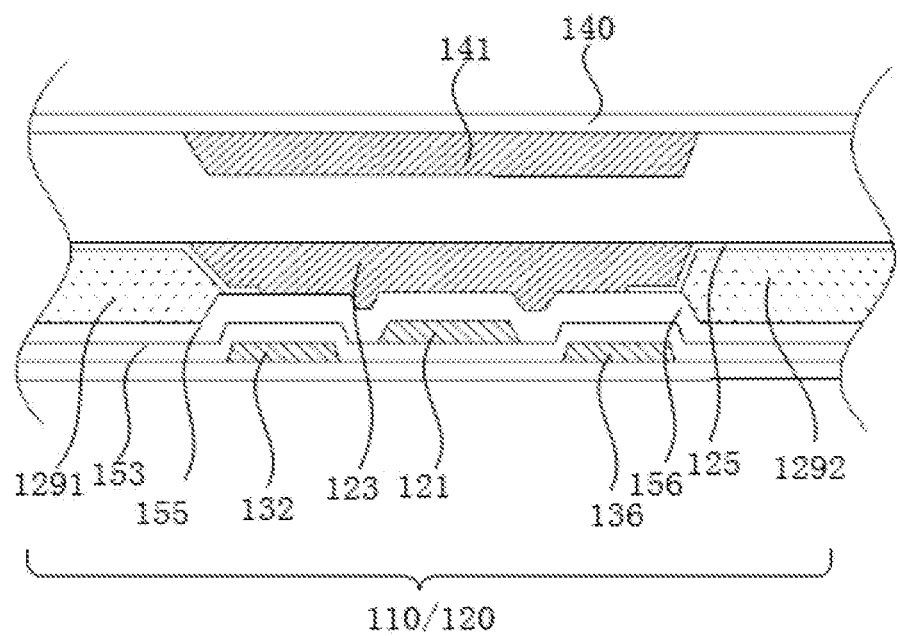
FIG. 8 is a schematic cross-sectional view of another display panel according to an embodiment of this application.
Figure 9:
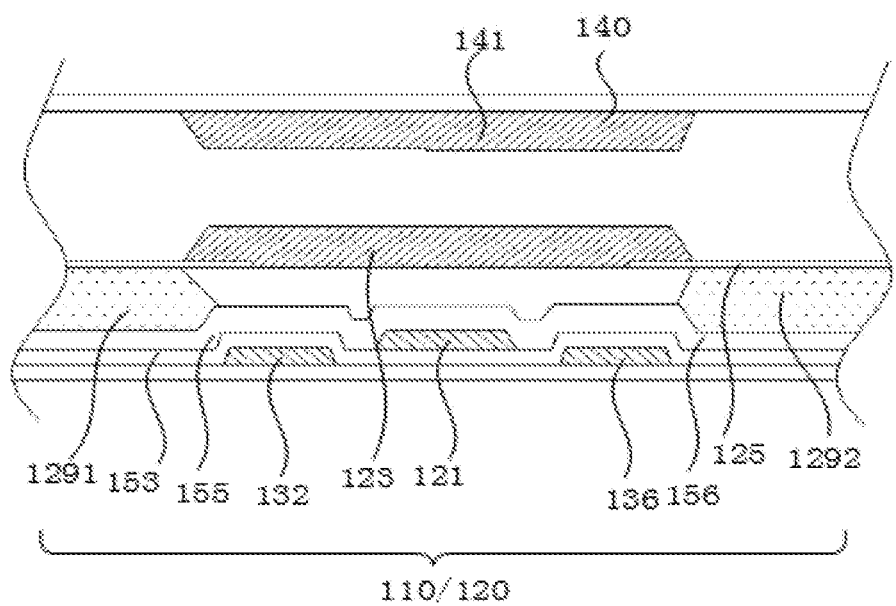
FIG. 9 is a schematic cross-sectional view of another display panel according to an embodiment of this application.
Figure 10:
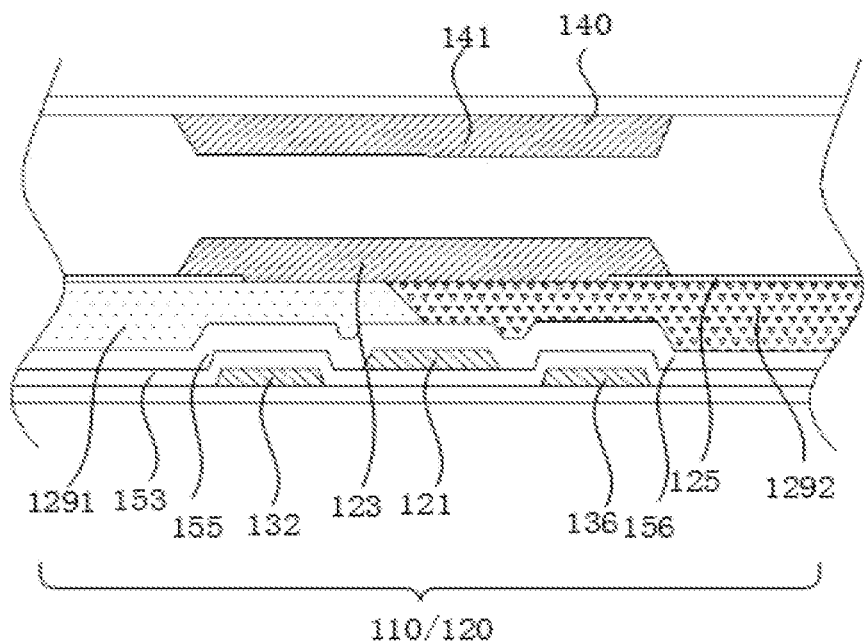
FIG. 10 is a schematic cross-sectional view of another display panel according to an embodiment of this application.

Specifically, the first pixel electrode 131 is formed by a transparent conductive thin film, and the first thin film transistor switch 138 corresponds to a thin film transistor switch below the first pixel element 130 shown in FIG. 2 and FIG. 3.

In this solution, the first shading layer 123 blocks the data line 121, the first gap 133, and the first common electrode line 132, and extends beyond the edge of the first common electrode line 132 close to the first pixel electrode 131. The first common electrode line 132 and the first pixel electrode 131 that are on different layers and partially overlap each other generate an electric field shielding effect, and correspondingly, no deflection of liquid crystals in this overlap area occurs. To prevent dark or bright fringes from being displayed in the overlap area between the first common electrode line 132 and the first pixel electrode 131, the overlap area needs to be blocked by a shading layer. To this end, the first shading layer 123 blocks the first common electrode line 132 and extends beyond the edge of the first common electrode line 132 close to the first pixel electrode 131. Light leakage easily occurs at the first gap 133 due to misalignment during cell-assembly of the first substrate 120 and the second substrate 140. To resolve this problem, the first shading layer 123 blocks the first gap 133 between the first common electrode line 132 and the data line 121.

In one or more embodiments, the pixel element 124 includes a second pixel element 134 neighboring to the first pixel element 130. The second pixel element 134 includes a second pixel electrode 135, and the data line 121 is arranged between the first pixel electrode 131 and the second pixel electrode 135. The second pixel element 134 further includes a second common electrode line 136 arranged between the first pixel electrode 131 and the second pixel electrode 135. The second common electrode line 136 and the second pixel electrode 135 are on different layers and partially overlap each other.

The second common electrode line 136 is arranged on a side of the data line 121 away from the first common electrode line 132. A second gap 137 is provided between the second common electrode line 136 and the data line 121. The first shading layer 123 further blocks the second gap 137 and the second common electrode line 136, and extends beyond an edge of the second common electrode line 136 close to the second pixel electrode 135.

In this solution, the first common electrode line 132 and the second common electrode line 136 are arranged respectively on two ends of the data line 121, the first gap 133 is provided between the first common electrode line 132 and the data line 121, and the second gap 137 is provided between the second common electrode line 136 and the data line 121. The first shading layer 123 not only blocks the first gap 133, the data line 121, and the first common electrode, line 132 as well as the second gap 137 and the second common electrode line 136, and respectively extends beyond the edge of the first common electrode line 132 close to the first pixel electrode 131 and the edge of a second common electrode line 136 close to the second pixel electrode 135. This design can effectively block the positions where light leakage is likely to occur and the positions where mura occurs due to electric field shielding or other reasons on the first pixel element 130 and the second pixel element 134.

Specifically, the first common electrode line 132 and the second common electrode line 136 are a small segment of a pixel element 124 corresponding a common electrode on a first substrate 120, and are in communication with each other.

In one or more embodiments, the first thin film transistor switch 138 includes a gate electrode 150, a gate insulation layer 153, an amorphous silicon layer 154, a source electrode 151 and a drain electrode 152 arranged on a same layer, and a first passivation layer 155. The color filter 129 includes a first color filter 1291. The first color filter 1291 is formed above the first passivation layer 155. The first shading layer 123 is formed at a gap between the first color filter 1291 and a neighboring color filter 129. The first pixel electrode 131 is formed above the first color filter 1291 and is partially stacked on an upper surface of the first shading layer 123 close to the first pixel electrode 131.

In this solution, the first shading layer 123 is arranged at the gap between the first color filter 1291 and the neighboring color filter 129, and the common electrode is formed in a manufacture procedure next to that of the first shading layer 123. In this way, the first shading layer 123 not only can prevent light leakage, but also can serve as a planarization layer to planarize the gap between the pixel electrodes 125 and the gap between the neighboring color filters 129. In addition, because the first pixel electrode 131 is partially stacked on the upper surface of the first shading layer 123 close to the first pixel electrode 131, it can be ensured that the first pixel electrode 131 and a first common electrode partially overlap to generate a shielding electric field, thereby alleviating the mura problem in the area close to the first pixel electrode 131 and the first common electrode.

In one or more embodiments, the pixel element 124 further includes a second pixel element 134. The second pixel element 134 includes a second thin film transistor switch 139. The second thin film transistor switch 139 includes a gate electrode 150, a gate insulation layer 153, an amorphous silicon layer 154, a source electrode 151 and a drain electrode 152 arranged on the same layer, and a second passivation layer 156.

The color filter 129 further includes a second color filter 1292. The second color filter 1292 is formed above the second passivation layer 156, and the first shading layer 123 is formed at a gap between the first color filter 1291 and the second color filter 1292. The second pixel electrode 135 is formed above the second color filter 1292 and is partially stacked on an upper surface of the first shading layer 123 close to the second pixel electrode 135.

Specifically, the second thin film transistor switch 139 corresponds to a thin film transistor switch below the second pixel element 134 in FIG. 2 or FIG. 3.

In this solution, the first shading layer 123 is arranged at the gap between the first color filter 1291 and the second color filter 1292, and the common electrode is formed in a manufacture procedure next to that of the first shading layer 123, in this way, the first shading layer 123 not only can prevent light leakage, but also can serve as a planarization layer to planarize the gap between the pixel electrodes 125 and the gap between the neighboring color filters 129. In addition, the second pixel electrode 135 is partially stacked on the upper surface of the first shading layer 123 close to the second pixel electrode 135, it can be ensured that the second pixel electrode 135 and a second common electrode partially overlap to generate a shielding electric field, thereby alleviating the mina problem in the area close to the second pixel electrode 135 and the second common electrode.

As another embodiment of this application, different from the foregoing embodiments, the first shading layer 123 is arranged to block all the data lines 121 and the scanning lines 221 in a one-to-one correspondence; the second shading layer 141 is arranged to block all the data lines 121 and the scanning lines 221 in a one-to-one correspondence; the first shading layer 123 is arranged corresponding to the second shading layer 141; and the first shading layer 123 and the second shading layer 141 have a same shape and size.

In this solution, because the position of the first shading layer 123 are arranged corresponding to that of the second shading layer 141, all the data lines 121 and the scanning lines 221 are blocked by both the two shading layers, thereby avoiding the case that light leakage occurs when the data line 121, the scanning line 221 or other structure is not blocked due to misalignment during cell-assembly of the first substrate 120 and the second substrate 140.

Because the first shading layer 123 and the second shading layer 141 have the same shape and size, the first shading layer 123 and the second shading layer 141 can be prepared by using the same mask while ensuring the shading effect, thereby saving one mask and reducing costs. The shapes and sizes of the first shading layer 123 and the second shading layer 141 are generally designed to be the same, but may be different in practical manufacture procedures. Even if there is a slight difference between the shapes or sizes of the first shading layer 123 and the second shading layer 141, it is considered that the first shading layer 123 and the second shading layer 141 have the same shape or size as long as the difference does not exceed a threshold.

As another embodiment of this application, different from the foregoing embodiments, the data line 121 and the scanning line 221 are respectively arranged corresponding to the pixel elements 124; the first shading layer 123 blocks a first part of the data lines 121 or the scanning lines 221; the second shading layer 141 blocks a second part of the data lines 121 or the scanning lines 221; and the first part and the second part are at least partially different.

In this solution, that the data lines 121 and the scanning lines 221 are blocked by the first shading layer 123 and/or the second shading layer 141 includes a plurality of cases. In one case, the first shading layer 123 blocks a first part of the data lines 121 or the scanning lines 221, and the second shading layer 141 blocks a second part of the data lines 121 or the scanning lines 221. In another case, a part of the data lines 121 or the scanning lines 221 are blocked only by the first shading layer 123, and another part of the data lines 121 or the scanning lines 221 axe blocked only by the second shading layer 141, and still another part of the data lines 121 or the scanning lines 221 are blocked by both the two shading layers. This design can reduce the total area of the shading layers, and conserve raw materials. Because the first substrate 120 including a plurality of data lines 121 and scanning lines 221 has a complex structure, the product yield may be reduced if too many shading layers are arranged on the first substrate 120. Therefore, the complementary blocking method can resolve this problem.

In one or more embodiments, the first substrate 120 includes a plurality of pixel elements 124, and data lines 121 and scanning lines 221 arranged corresponding to the pixel elements 124. The pixel element 124 includes a thin film transistor switch 126 connected to the scanning line 221. The second substrate 140 includes a second shading layer 141. The first shading layer 123 blocks the data line 121. The second shading layer 141 blocks the scanning line 221 and the thin film transistor switch 126.

Specifically, the thin film transistor switch 126 is generally arranged on the scanning line 221. A width of the part at which the thin film transistor switch 126 is arranged may be equal to or greater than a width of the scanning line 221. If the width of the part at which the thin film transistor switch 126 is arranged is greater than the width of scanning line 221, the part of the second shading layer 141 corresponding to the scanning line 221 is widened to block the thin film transistor switch 126.

Because severe light leakage may occur at the data line 121, especially for an architecture in which a common electrode line is arranged between pixel electrodes 125, arranging the first shading layer 123 at the data line 121 in this solution can effectively reduce light leakage. Light leakage at the corresponding scanning line 221 is mild, and because the wiring at the array substrate side is dense, the introduction of an additional structure may reduce the product yield. Therefore, arranging unnecessary structures such as a shading layer on the color film substrate side helps improve the product yield. In this solution, the second shading layer 141 may be arranged on the second substrate 140, so as to simplify the structure of the first substrate 120 while well preventing light leakage, thereby improving the yield of the display panel 110.

In one or more embodiments, the first shading layer and the material of a second shading layer are made of a same material. This solution reduces manufacture procedures, saving time and manpower.

Figure 13:
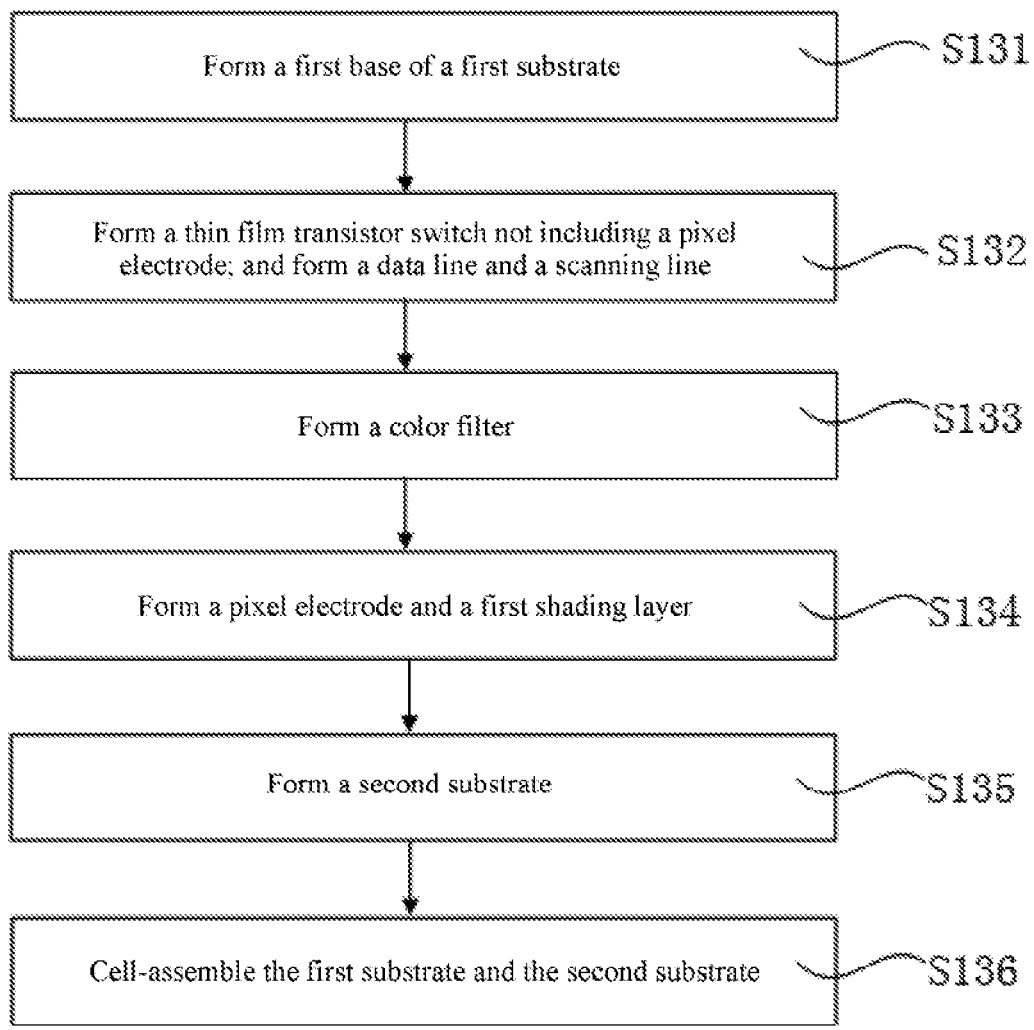
FIG. 13 is a flowchart of a method for manufacturing a first substrate according to an embodiment of this application.

As another embodiment of this application, referring to FIG. 13, a method for manufacturing a display panel 110 is disclosed, including: S131: forming a first base of a first substrate;

S132: forming, on the first base, a thin film transistor switch not including a pixel electrode; and forming a data line and a scanning line beside the thin film transistor switch;

S133: forming a color filter above the thin film transistor switch;

S134: respectively forming, above the color filter, a pixel electrode, and a first shading layer configured to block the data line and the scanning line, to obtain the first substrate;

S135: forming a second shading layer configured to block the data line and the scanning line, to obtain a second substrate; and S136: cell-assembling the first substrate and the second substrate, so that the second shading layer correspondingly blocks the data line and the scanning line.

Figure 11:
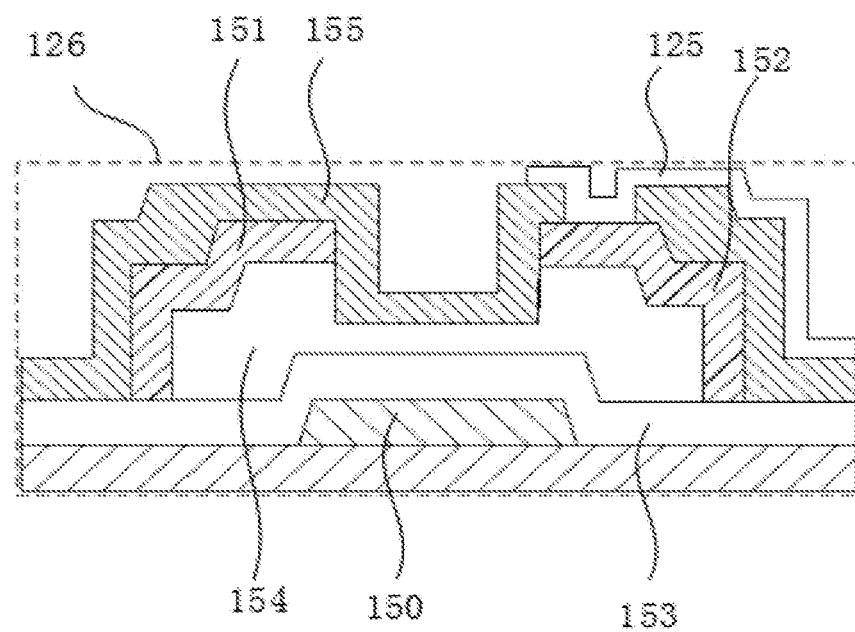
FIG. 11 is a schematic cross-sectional view of a thin film transistor switch according to an embodiment of this application.
Figure 14:
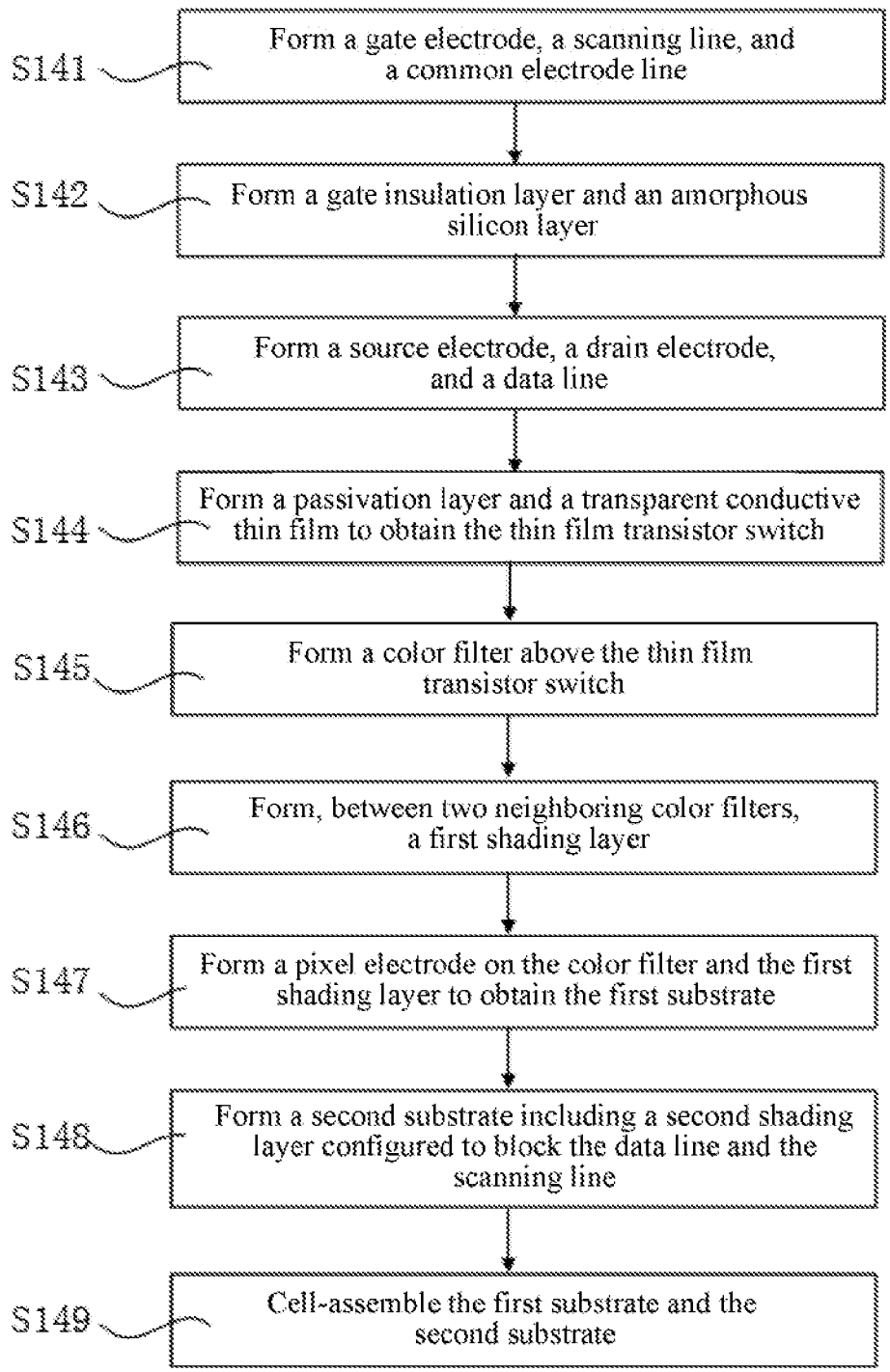
FIG. 14 is a flowchart of a method for manufacturing a display panel according to an embodiment of this application.

As another embodiment of this application, referring to FIG. 11 and FIG. 14, a method for manufacturing a display panel is disclosed, including: S141: forming a first base of the first substrate, and forming, on the first base, a gate electrode, a scanning line on a same layer as the gate electrode and connected to the gate electrode, and a common electrode line;

S142: forming a gate insulation layer and an amorphous silicon layer above the gate electrode;

S143: forming, above the amorphous silicon layer, a source electrode and a drain electrode arranged on a same layer, and a data line connected to the source electrode or the drain electrode;

S144: forming, above the source electrode and the drain electrode, a passivation layer and a transparent conductive thin film partially overlapping the common electrode line to obtain the thin film transistor switch;

S145: forming a color filter above the thin film transistor switch;

S146: forming, between two neighboring color filters, a first shading layer configured to block the data line and a scanning line;

S147: forming a pixel electrode on the color filter and the first shading layer to obtain the first substrate;

S148: forming a second substrate including a second shading layer configured to block the data line and the scanning line; and S149: cell-assembling the first substrate and the second substrate, so that the second shading layer correspondingly blocks the data line and the scanning line.

Figure 12:
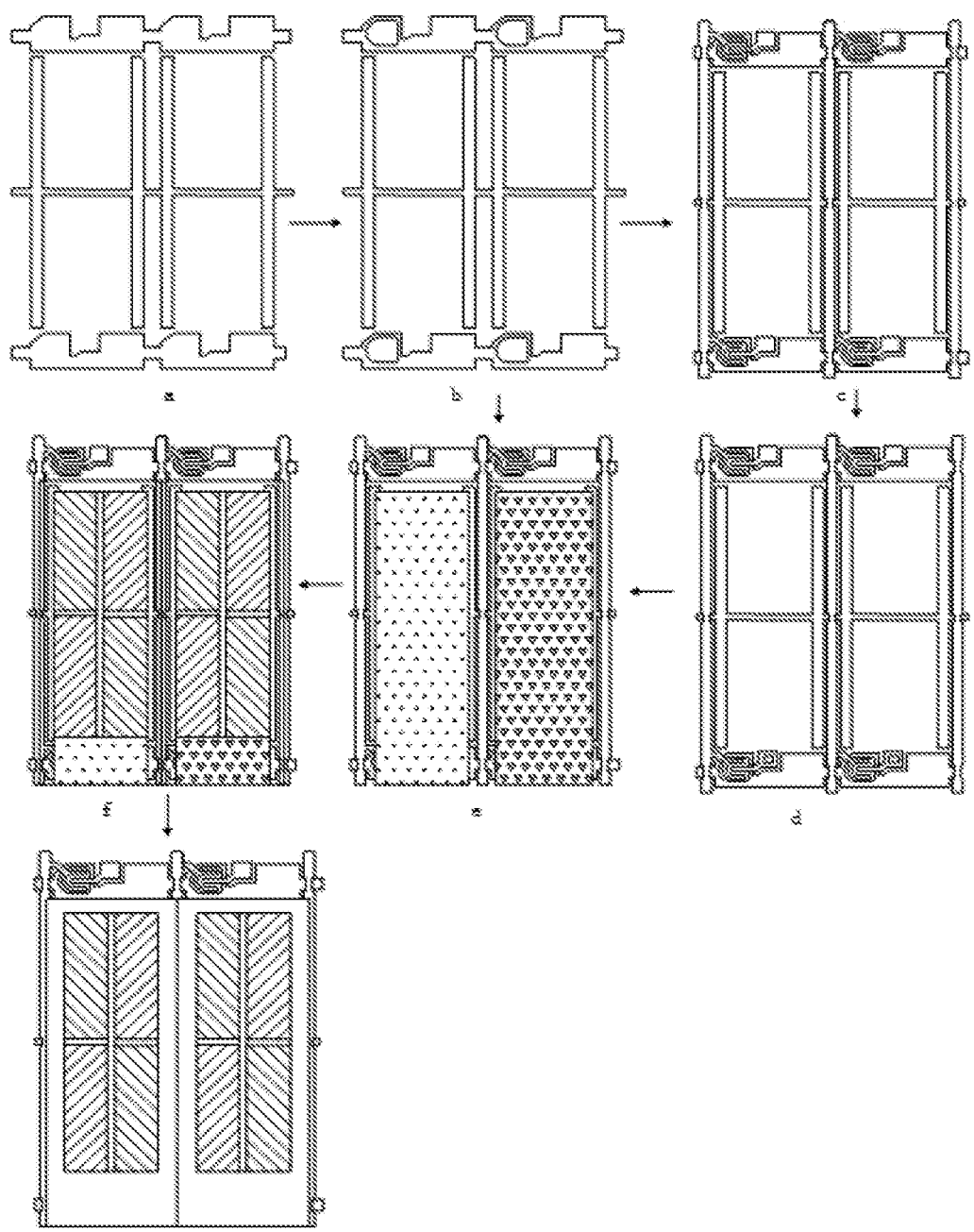
FIG. 12 is a schematic diagram of a method for manufacturing a first substrate according to an embodiment of this application.
Figure 15:
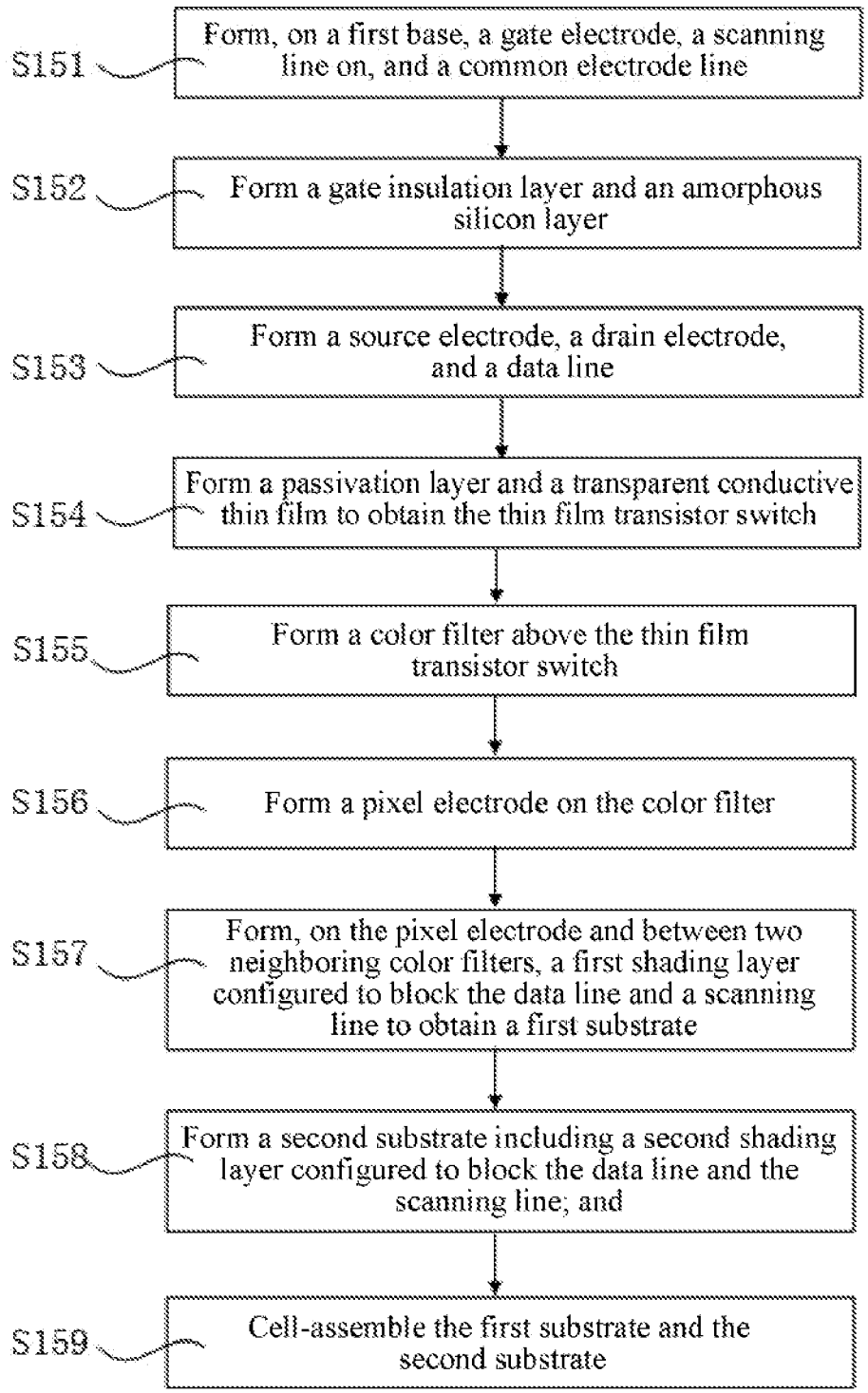
FIG. 15 is a flowchart of another method for manufacturing a display panel according to an embodiment of this application.
Figure 16:
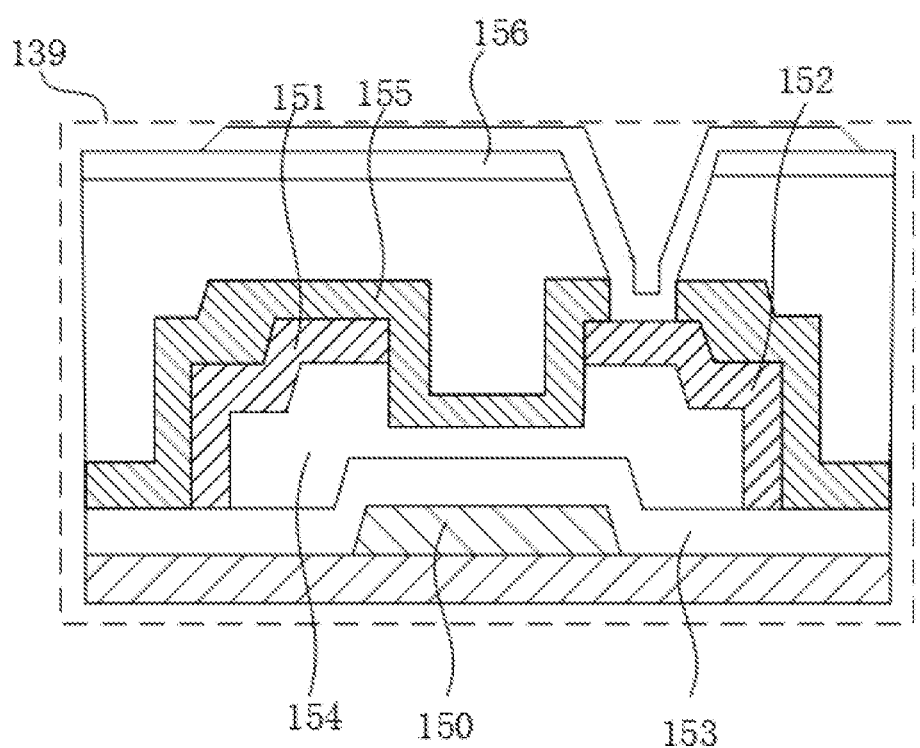
FIG. 16 is a schematic cross-sectional view of another thin film transistor switch according to an embodiment of this application.

As another embodiment of this application, referring to FIG. 11, FIG. 12, and FIG. 15, a method for manufacturing, a display panel is disclosed, including: S151: referring to figure a in FIG. 12, forming, on a first base, a gate electrode, a scanning line on a same layer as the gate electrode and connected to the gate electrode, and a common electrode line;

S152: referring to figure b in FIG. 12, forming a gate insulation layer and an amorphous silicon layer above the gate electrode;

S153: referring to figure c in FIG. 12, forming, above the amorphous silicon layer, a source electrode and a drain electrode arranged on a same layer, and a data line connected to the source electrode or the drain electrode;

S154: referring to figure d in FIG. 12, forming, above the source electrode and the drain electrode, a passivation layer and a transparent conductive thin film partially overlapping the common electrode line to obtain the thin film transistor switch;

S155: referring to figure e in FIG. 12, forming a color filter above the thin film transistor switch;

S156: referring to figure f in FIG. 12, forming a pixel electrode on the color filter;

S157: referring to figure g in FIG. 12, forming, on the pixel electrode and between two neighboring color filters, a first shading layer configured to block the data line and a scanning line to obtain a first substrate;

S158: forming a second substrate including a second shading layer configured to block the data line and the scanning line; and S159: cell-assembling the first substrate and the second substrate, so that the second shading layer correspondingly blocks the data line and the scanning line.

As another embodiment of this application, different from the foregoing embodiments, the first shading layer blocks the data line and the common electrode line, extends beyond an edge of the common electrode line close to the pixel electrode, and does not block the scanning line;

the second shading layer is formed between some color filters; and during cell-assembly, the second shading layer is made corresponding to the scanning line, to block the scanning line.

As another embodiment of this application, referring to FIG. 1, this application discloses a display device 100, including any of the above display panels 110.

It should be noted that on the premise of not affecting the implementation of specific solutions, the descriptions of the steps in this application shall not be construed as limiting the execution order of the steps. A step mentioned earlier that another step may be executed before, after, or concurrently with the another step. Such execution orders shall all fall within the scope of this application as long as this application can be implemented.

The technical solution of this application may be widely applied to a Twisted Nematic (TN) panel, an In-Plane Switching (IPS) panel, or a Multi-domain Vertical Alignment (VA) panel, and may certainly be applied to any other suitable type of panel.

The foregoing content describes this application in detail with reference to the specific implementation manners, and it should not be regarded that the specific implementations of this application are limited to these descriptions. Persons of ordinary skill in the art can further make simple deductions or replacements without departing from the concept of this application, and such deductions or replacements should all be considered as falling within the protection scope of this application.

What is claimed is:

1. A display panel, having a display area and a peripheral area, and comprising:
    a first substrate;
    a second substrate, cell-assembled to the first substrate;
    a plurality of pixel elements, arranged on the first substrate;
    a plurality of data lines and scanning lines, arranged on the first substrate and between two neighboring pixel elements; and
    a plurality of color filters, arranged above the corresponding pixel elements on the first substrate, wherein
    the first substrate comprises a first shading layer, the first shading layer being formed between two neighboring pixel elements to block the data lines or the scanning lines;
    the display area comprises an opening area and a non-opening area, and the first shading layer is arranged only in the non-opening area;
    the second substrate comprises a second shading layer arranged corresponding to the first shading layer; and
    each of the data lines and the scanning lines is blocked by at least one of the first shading layer and the second shading layer;
    wherein the pixel element comprises a first pixel element and the data line is arranged on an outer side of the first pixel element;
    the first pixel element comprises a first thin film transistor switch, a first pixel electrode, and a first common electrode line arranged on an outer side of the first pixel electrode, and the first common electrode line and the first pixel electrode are on different layers and partially overlap each other;

the first common electrode line is arranged on a side of the data line, and a first gap is provided between the first common electrode line and the data line;

the first pixel electrode is connected to a source electrode or a drain electrode of the first thin film transistor switch through a via-hole; and the first shading layer blocks the data line, the first gap, and the first common electrode line, and extends beyond an edge of the first common electrode line adjacent to the first pixel electrode;

wherein the pixel element comprises a second pixel element neighboring to the first pixel element, the second pixel element comprises a second pixel electrode, and the data line is arranged between the first pixel electrode and the second pixel electrode;

the second pixel element further comprises a second common electrode line arranged between the first pixel electrode and the second pixel electrode, and the second common electrode line and the second pixel electrode are on different layers and partially overlap each other;

the second common electrode line is arranged on a side of the data line away from the first common electrode line, and a second gap is provided between the second common electrode line and the data line; and the first shading layer further blocks the second gap and the second common electrode line, and extends beyond an edge of the second common electrode line adjacent to the second pixel electrode;

wherein the first pixel electrode is partially stacked on and in direct contact with an upper surface of a portion of the first shading layer adjacent to the first pixel electrode, and the second pixel electrode is partially stacked on and in direct contact with an upper surface of another portion of the first shading layer adjacent to the second pixel electrode.

2. The display panel according to claim 1, wherein the first substrate is a color-on-array substrate, and the second substrate is a common substrate.

3. The display panel according to claim 1, wherein the first common electrode line and the second common electrode line are each a partial segment of the respective pixel element corresponding to a common electrode on the first substrate, and are coupled with each other.

4. The display panel according to claim 1, wherein the first thin film transistor switch comprises a gate electrode, a gate insulation layer, an amorphous silicon layer, the source electrode and the drain electrode arranged on a same layer, and a first passivation layer;

the plurality of color filters comprise a first color filter, the first color filter being formed above the first passivation layer;

the first shading layer is formed at a gap between the first color filter and a neighboring color filter; and the first pixel electrode is formed above the first color filter.

5. The display panel according to claim 4, wherein the second pixel element comprises a second thin film transistor switch;

the second thin film transistor switch comprises a gate electrode, a gate insulation layer, an amorphous silicon layer, a source electrode and a drain electrode arranged on a same layer, and a second passivation layer;

the plurality of color filters further comprise a second color filter;

the second color filter is formed above the second passivation layer, and the first shading layer is formed at a gap between the first color filter and the second color filter; and the second pixel electrode is formed above the second color filter.

6. The display panel according to claim 1, wherein the first shading layer is arranged to block all of the data lines and the scanning lines in a one-to-one correspondence; the second shading layer is arranged to block all of the data lines and the scanning lines in a one-to-one correspondence;

the first shading layer is arranged corresponding to the second shading layer; and the first shading layer and the second shading layer have a same shape and size.

7. The display panel according to claim 1, wherein the data lines and the scanning lines are respectively arranged corresponding to the pixel elements;

the first shading layer blocks a first part of the data lines;

the second shading layer blocks a second part of the data lines; and the first part and the second part are at least partially different.

8. The display panel according to claim 7, wherein the pixel element comprises a thin film transistor switch connected to the scanning line;

the first shading layer blocks the data line; and the second shading layer blocks the scanning line and the thin film transistor switch.

9. The display panel according to claim 1, wherein the first common electrode line is a straight line segment that runs through an entire length of the first pixel element and the second common electrode line is also a straight line segment running through an entire length of the second pixel element; wherein the first common electrode line and the second common electrode line are arranged side by side and in parallel with each other, and have substantially the same length; wherein the first common electrode line and the second common electrode line are electrically connected to each other through a line segment connecting substantially middle point of the first common electrode line and the second common electrode line.

10. The display panel according to claim 1, wherein the second common electrode line is formed to serve as the first shading layer, which overlaps each of the first pixel electrode and the second pixel electrode, wherein the second common electrode line covers the data line, the first gap, and the first common electrode line, and extends beyond the edge of the first common electrode line adjacent to the first pixel electrode.

11. The display panel according to claim 5, wherein the first color filter is separated from the second color filter by the gap, and wherein the first shading layer is disposed at the gap and abuts both the first color filter and the second color filter.

12. The display panel according to claim 1, wherein the first shading layer comprises a closed-loop annular frame that extends along all sides of a pixel electrode of the respective pixel element to cover the respective data lines and scanning lines.

13. A method for manufacturing a display panel, comprising:

forming a base of a first substrate;

forming, on the base, a thin film transistor switch not comprising a pixel electrode; and forming a data line and a scanning line beside the thin film transistor switch;

forming a color filter above the thin film transistor switch;
respectively forming, above the color filter, a pixel electrode, and a first shading layer configured to block the data line and the scanning line, to obtain the first substrate;
forming a second shading layer configured to block the data line and the scanning line, to obtain a second substrate; and
cell-assembling the first substrate and the second substrate, so that the second shading layer correspondingly blocks the data line and the scanning line;
wherein the display panel comprises a plurality of pixel elements arranged on the first substrate;
wherein the plurality of pixel elements comprise a first pixel element and the data line is arranged on an outer side of the first pixel element;
the first pixel element comprises a first thin film transistor switch, a first pixel electrode, and a first common electrode line arranged on an outer side of the first pixel electrode, and the first common electrode line and the first pixel electrode are on different layers and partially overlap each other;
the first common electrode line is arranged on a side of the data line, and a first gap is provided between the first common electrode line and the data line;
the first pixel electrode is connected to a source electrode or a drain electrode of the first thin film transistor switch through a via-hole; and
the first shading layer blocks the data line, the first gap, and the first common electrode line, and extends beyond an edge of the first common electrode line close to the first pixel electrode;
wherein the plurality of pixel elements further comprise a second pixel element neighboring to the first pixel element, the second pixel element comprises a second pixel electrode, and the data line is arranged between the first pixel electrode and the second pixel electrode;
the second pixel element further comprises a second common electrode line arranged between the first pixel electrode and the second pixel electrode, and the second common electrode line and the second pixel electrode are on different layers and partially overlap each other;
the second common electrode line is arranged on a side of the data line away from the first common electrode line, and a second gap is provided between the second common electrode line and the data line; and
the first shading layer further blocks the second gap and the second common electrode line, and extends beyond an edge of the second common electrode line close to the second pixel electrode;
wherein the first pixel electrode is partially stacked on and in direct contact with an upper surface of a portion of the first shading layer adjacent to the first pixel electrode, and the second pixel electrode is partially stacked on and in direct contact with an upper surface of another portion of the first shading layer adjacent to the second pixel electrode.

14. The method for manufacturing a display panel according to claim 13, comprising:
forming a first base of the first substrate, and forming, on the first base, a gate electrode, a scanning line on a same layer as the gate electrode and connected to the gate electrode, and a common electrode line;
forming a gate insulation layer and an amorphous silicon layer above the gate electrode;
forming, above the amorphous silicon layer, a source electrode and a drain electrode arranged on a same layer, and a data line connected to the source electrode or the drain electrode;
forming, above the source electrode and the drain electrode, a passivation layer and a transparent conductive thin film partially overlapping the common electrode line to obtain the thin film transistor switch;
forming a color filter above the thin film transistor switch;
forming, between two neighboring color filters, a first shading layer configured to block the data line and a scanning line;
forming a pixel electrode on the color filter and the first shading layer to obtain the first substrate;
forming a second substrate configured to block the data line, the scanning line, and the second shading layer; and
cell-assembling the first substrate and the second substrate, so that the second shading layer correspondingly blocks the data line and the scanning line.

15. The method for manufacturing a display panel according to claim 13, wherein the first shading layer blocks the data line and the common electrode line, extends beyond an edge of the common electrode line close to the pixel electrode, and does not block the scanning line;
the second shading layer is formed between some color filters; and
during cell-assembly, the second shading layer is made corresponding to the scanning line, to block the scanning line.

16. A display device, wherein the display device comprises a display panel, the display panel has a display area and a peripheral area, and the display panel comprises:
a first substrate;
a second substrate, cell-assembled to the first substrate;
a plurality of pixel elements, arranged on the first substrate;
a plurality of data lines and scanning lines, arranged on the first substrate and between two neighboring pixel elements; and
a plurality of color filters, arranged above the corresponding pixel elements on the first substrate, wherein
the first substrate comprises a first shading layer, the first shading layer being formed between two neighboring pixel elements to block the data lines or the scanning lines;
the display area comprises an opening area and a non-opening area, and the first shading layer is arranged only in the non-opening area;
the second substrate comprises a second shading layer arranged corresponding to the first shading layer; and
each of the data lines and the scanning lines is blocked by at least one of the first shading layer and the second shading layer;
wherein the pixel element comprises a first pixel element and the data line is arranged on an outer side of the first pixel element;
the first pixel element comprises a first thin film transistor switch, a first pixel electrode, and a first common electrode line arranged on an outer side of the first pixel electrode, and the first common electrode line and the first pixel electrode are on different layers and partially overlap each other;
the first common electrode line is arranged on a side of the data line, and a first gap is provided between the first common electrode line and the data line;

the first pixel electrode is connected to a source electrode or a drain electrode of the first thin film transistor switch through a via-hole; and the first shading layer blocks the data line, the first gap, and the first common electrode line, and extends beyond an edge of the first common electrode line close to the first pixel electrode;

wherein the pixel element comprises a second pixel element neighboring to the first pixel element, the second pixel element comprises a second pixel electrode, and the data line is arranged between the first pixel electrode and the second pixel electrode;

the second pixel element further comprises a second common electrode line arranged between the first pixel electrode and the second pixel electrode, and the second common electrode line and the second pixel electrode are on different layers and partially overlap each other;

the second common electrode line is arranged on a side of the data line away from the first common electrode line, and a second gap is provided between the second common electrode line and the data line; and the first shading layer further blocks the second gap and the second common electrode line, and extends beyond an edge of the second common electrode line close to the second pixel electrode;

wherein the first pixel electrode is partially stacked on and in direct contact with an upper surface of a portion of the first shading layer adjacent to the first pixel electrode, and the second pixel electrode is partially stacked on and in direct contact with an upper surface of another portion of the first shading layer adjacent to the second pixel electrode.

17. The display device according to claim 16, wherein the first shading layer is arranged to block all of the data lines and the scanning lines in a one-to-one correspondence; the second shading layer is arranged to block all of the data lines and the scanning lines in a one-to-one correspondence;

the first shading layer is arranged corresponding to the second shading layer; and the first shading layer and the second shading layer have a same shape and size.

* * * * *